(12) United States Patent
Pietambaram et al.

(10) Patent No.: US 12,087,695 B2
(45) Date of Patent: Sep. 10, 2024

(54) HYBRID FAN-OUT ARCHITECTURE WITH EMIB AND GLASS CORE FOR HETEROGENEOUS DIE INTEGRATION APPLICATIONS

(71) Applicant: Intel Corporation, Santa Clara, CA (US)

(72) Inventors: Srinivas Pietambaram, Gilbert, AZ (US); Rahul Manepalli, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/224,794

(22) Filed: Jul. 21, 2023

(65) Prior Publication Data

US 2023/0361044 A1 Nov. 9, 2023

Related U.S. Application Data

(63) Continuation of application No. 17/732,365, filed on Apr. 28, 2022, now Pat. No. 11,756,890, which is a
(Continued)

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4853* (2013.01); *H01L 21/486* (2013.01);
(Continued)

(58) Field of Classification Search
CPC ............. H01L 23/5381; H01L 21/4853; H01L 21/486; H01L 21/565; H01L 21/6835
See application file for complete search history.

(56) References Cited

U.S. PATENT DOCUMENTS

2004/0035917 A1 2/2004 Koopmans
2009/0267238 A1 10/2009 Joseph et al.
(Continued)

FOREIGN PATENT DOCUMENTS

| KR | 10-2014-0113467 A | 9/2014 |
| KR | 10-2016-0100185 A | 8/2016 |
| WO | WO 2016-130317 | 8/2016 |

OTHER PUBLICATIONS

International Preliminary Report on Patentability for International Patent Application No. PCT/US2019/031182, mailed Jan. 7, 2021, 10 pgs.
(Continued)

*Primary Examiner* — Thao P Le
(74) *Attorney, Agent, or Firm* — Schwabe, Williamson & Wyatt P.C.

(57) ABSTRACT

Embodiments disclosed herein include electronic packages and methods of forming such packages. In an embodiment, a microelectronic device package may include a redistribution layer (RDL) and an interposer over the RDL. In an embodiment, a glass core may be formed over the RDL and surround the interposer. In an embodiment, the microelectronic device package may further comprise a plurality of dies over the interposer. In an embodiment, the plurality of dies are communicatively coupled with the interposer.

20 Claims, 18 Drawing Sheets

Related U.S. Application Data continuation of application No. 16/024,707, filed on Jun. 29, 2018, now Pat. No. 11,355,438.

(51) Int. Cl.
  *H01L 21/56* (2006.01)
  *H01L 21/683* (2006.01)
  *H01L 23/00* (2006.01)
  *H01L 23/31* (2006.01)
  *H01L 25/00* (2006.01)
  *H01L 25/065* (2023.01)

(52) U.S. Cl.
  CPC ........ *H01L 21/565* (2013.01); *H01L 21/6835* (2013.01); *H01L 23/3107* (2013.01); *H01L 23/5384* (2013.01); *H01L 23/5386* (2013.01); *H01L 23/562* (2013.01); *H01L 25/0652* (2013.01); *H01L 25/50* (2013.01); *H01L 2221/68372* (2013.01); *H01L 2225/06513* (2013.01); *H01L 2225/06548* (2013.01); *H01L 2225/06558* (2013.01); *H01L 2225/06582* (2013.01); *H01L 2225/06589* (2013.01)

(56) References Cited

U.S. PATENT DOCUMENTS

| | | |
|---|---|---|
| 2013/0147023 A1 | 6/2013 | Lin |
| 2013/0200511 A1 | 8/2013 | Banijamali et al. |
| 2014/0347834 A1 | 11/2014 | Lee et al. |
| 2015/0270209 A1 | 9/2015 | Woychik et al. |
| 2015/0380388 A1 | 12/2015 | Yu |
| 2016/0016791 A1 | 1/2016 | Jacobs |
| 2016/0093571 A1 | 3/2016 | Kim et al. |
| 2016/0293550 A1 | 10/2016 | Standing et al. |
| 2016/0293572 A1 | 10/2016 | We et al. |
| 2017/0005058 A1 | 1/2017 | Hurwitz |
| 2017/0110407 A1 | 4/2017 | Chaware |
| 2017/0170121 A1 | 6/2017 | Haba |
| 2018/0190580 A1 | 7/2018 | Haba |
| 2019/0341320 A1 | 11/2019 | Pollard |
| 2022/0230946 A1 | 7/2022 | Shih |
| 2022/0238413 A1 | 7/2022 | Grassmann |
| 2023/0085411 A1 | 3/2023 | Paital |
| 2023/0092242 A1 | 3/2023 | Pietambaram |
| 2023/0094686 A1 | 3/2023 | Darmawikarta |
| 2023/0103183 A1 | 3/2023 | Darmawikarta |
| 2023/0104330 A1 | 4/2023 | Ecton |
| 2023/0134049 A1 | 5/2023 | Mallik |
| 2024/0055365 A1* | 2/2024 | Wu ................... H01L 23/552 |
| 2024/0079310 A1* | 3/2024 | Kessler ................ H01L 24/16 |
| 2024/0079334 A1* | 3/2024 | Ecton .............. H01L 25/0655 |
| 2024/0120305 A1* | 4/2024 | Ecton .................. H01L 24/16 |
| 2024/0128197 A1* | 4/2024 | Zschieschang ....... H01L 21/56 |
| 2024/0128255 A1* | 4/2024 | Elsherbini ........... H01L 24/14 |

OTHER PUBLICATIONS

International Search Report and Written Opinion for International Patent Application No. PCT/US2019/031182, mailed Aug. 22, 2019, 13 pages.

Office Action for Taiwan Patent Application No. 108116887 mailed Sep. 27, 2022, 11 pgs., with English translation.

Notice of Allowance from Taiwan Patent Application No. 108116887, mailed Mar. 20, 2023, 3 pages.

Office Action for Korean Patent Application No. 10-2023-7039074 mailed Mar. 29, 2024, 11 pgs.

Office Action for Korean Patent Application No. KR 10-2020-7025512 mailed May 16, 2024, 9 pgs.

* cited by examiner

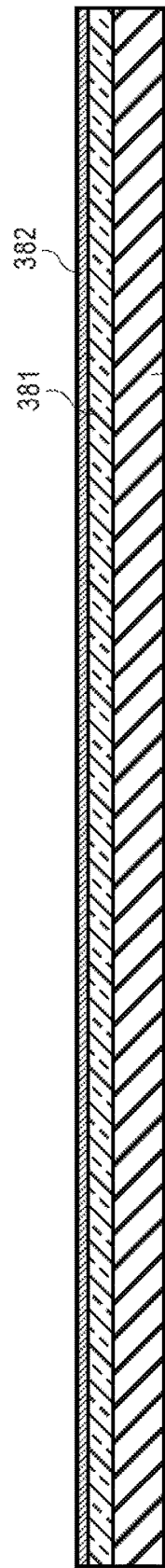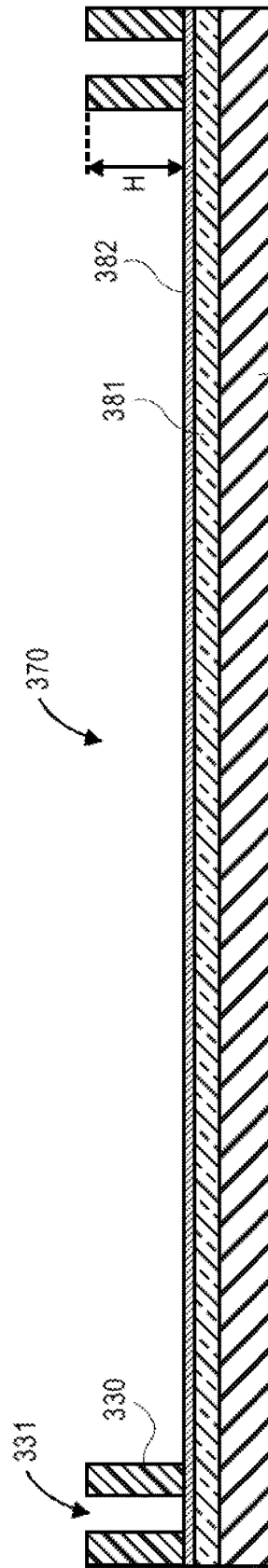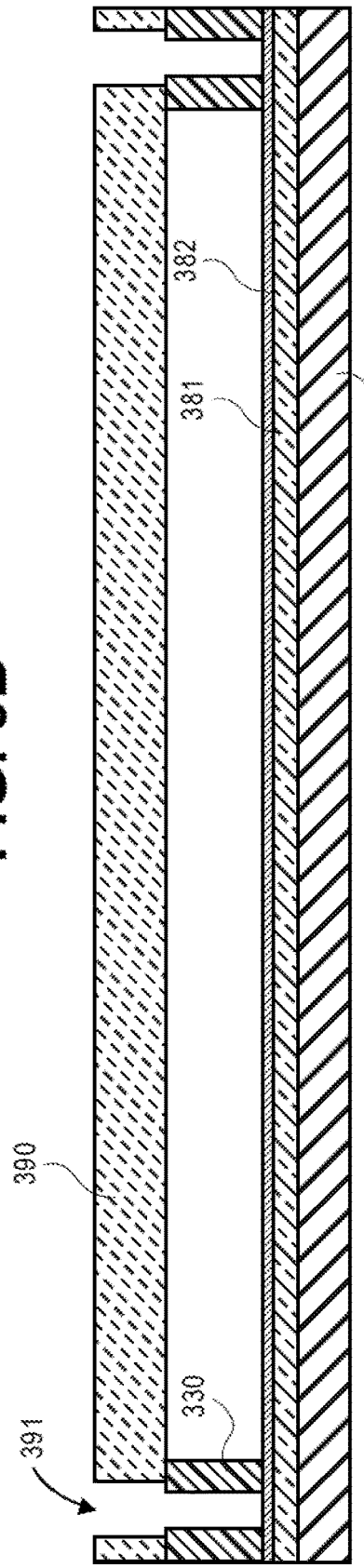

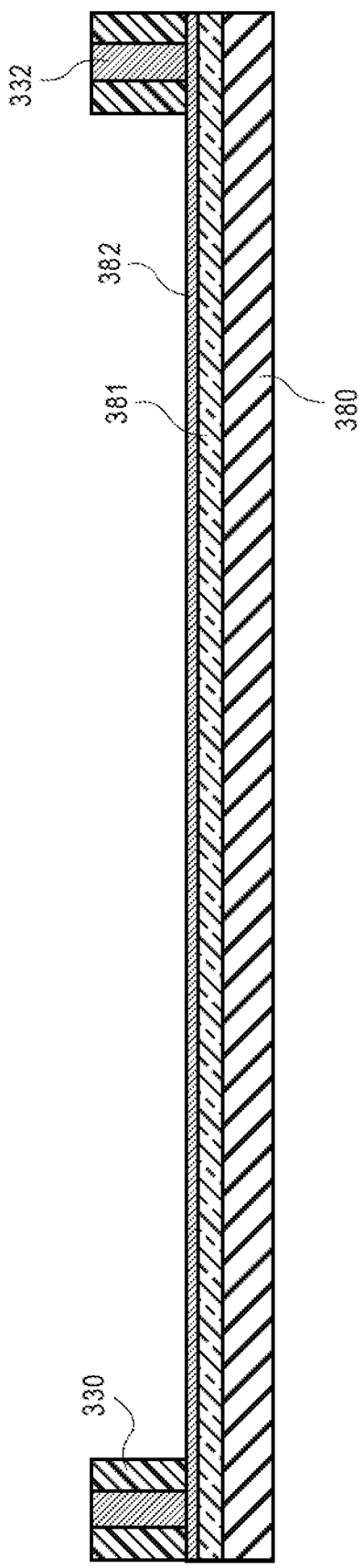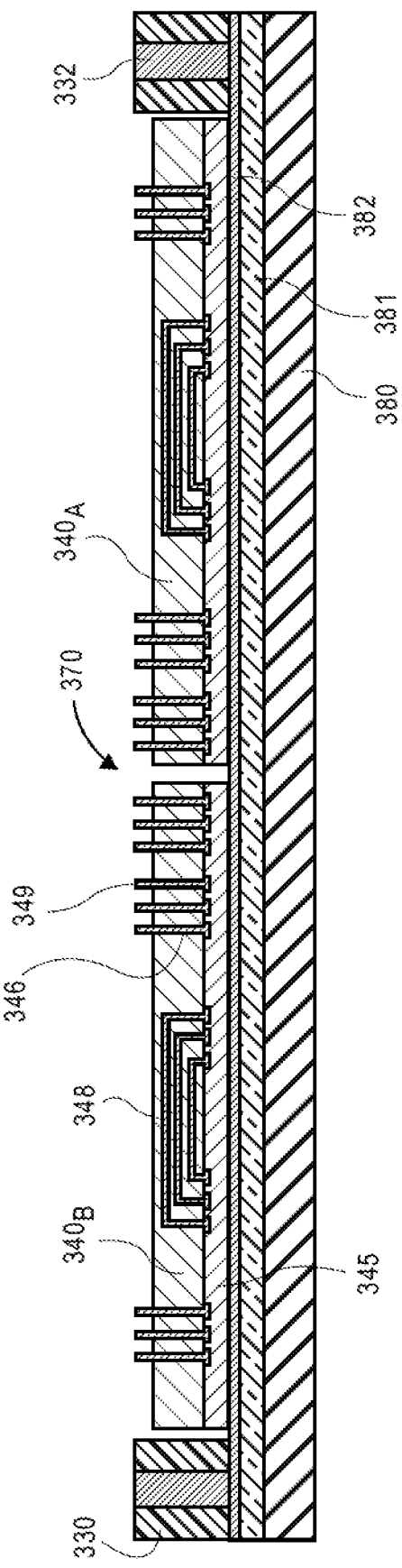

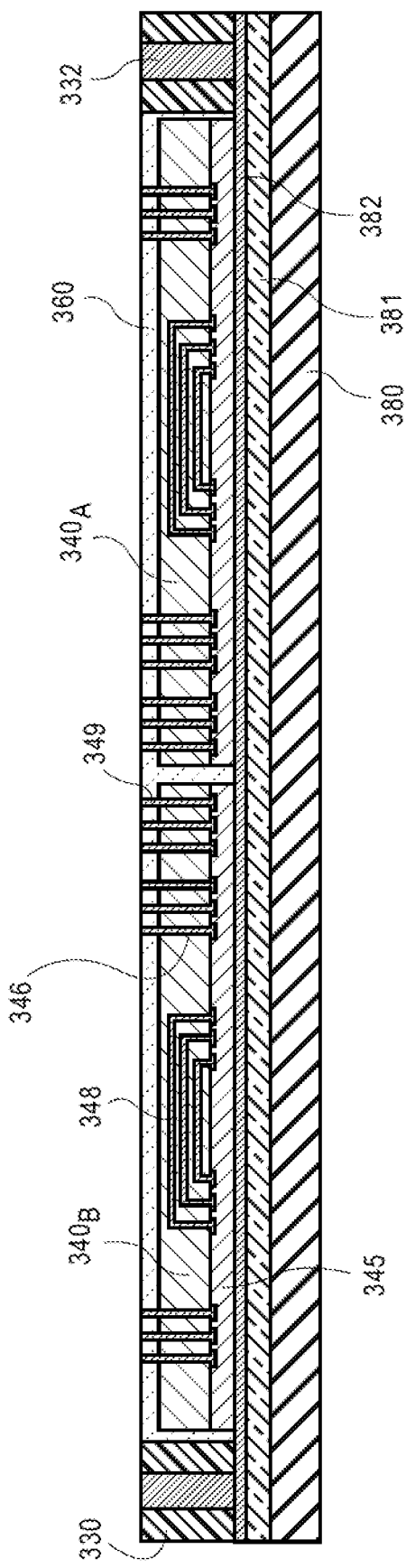
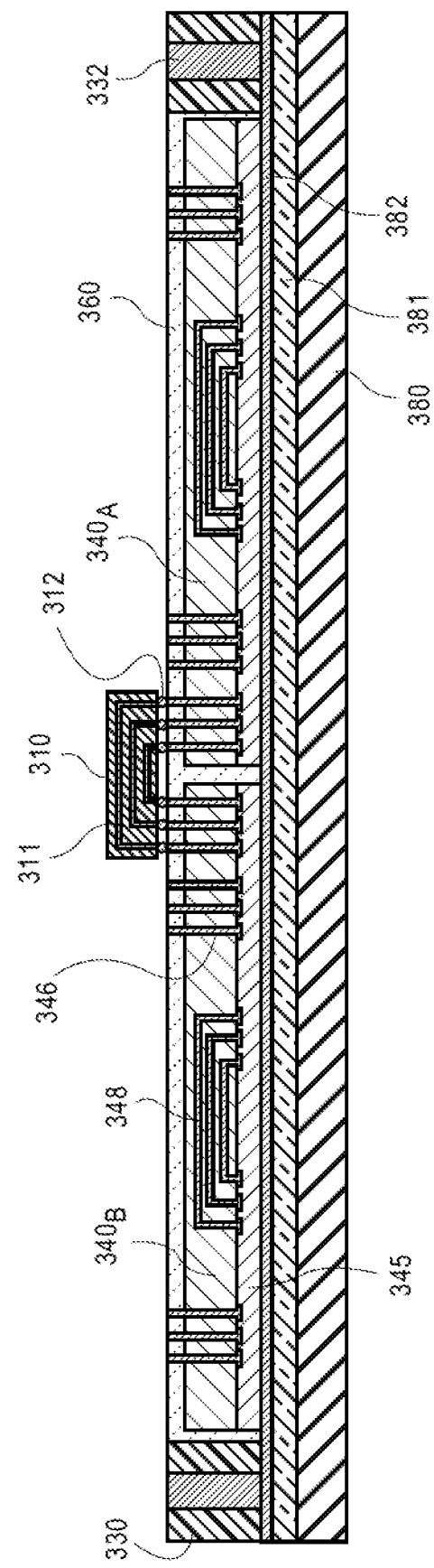
FIG. 3H
FIG. 3I

HYBRID FAN-OUT ARCHITECTURE WITH EMIB AND GLASS CORE FOR HETEROGENEOUS DIE INTEGRATION APPLICATIONS

CROSS-REFERENCE TO RELATED APPLICATIONS

This application is a continuation of U.S. patent application Ser. No. 17/732,365 filed Apr. 28, 2022, which is a continuation of U.S. patent application Ser. No. 16/024,707, filed on Jun. 29, 2018, now U.S. Pat. No. 11,355,438, issued Jun. 7, 2022, the entire contents of which are hereby incorporated by reference herein.

TECHNICAL FIELD

Embodiments of the present disclosure relate to electronics packaging, and more particularly, to electronics packages with a plurality of interconnected dies with a glass core.

BACKGROUND

Conventional die manufacturing techniques are being pushed to their limits for size of a monolithic die, yet applications are yearning for capabilities that are possible for large dimensional integrated circuits using the latest technology such as 7 nm gate lengths. As monolithic dies have become bigger, small differences that can be overlooked for smaller dies, cannot be compensated for and can often significantly reduce yield. Recent solutions can involve using smaller integrated circuits interconnected with a semiconductor interposer or integrated with silicon bridges embedded in a silicon substrate to provide a heterogeneous-chip package.

In embodiments involving integration of multiple dies with silicon bridges, dies are communicatively coupled by bridges in order to provide the desired functionalities but the added complexity in the packaging is a significant challenge. For example, CTE mismatches between the die, the die back film (DBF), build-up dielectric layers, and encapsulation materials leads to significant die warpage. This is particularly problematic during a planarization operation needed in most of the architectural approaches using this method to reveal copper pillars and the die backside interconnects (Through Silicon Vias, TSVs). The die warpage prevents both the copper pillars and die interconnects from being exposed simultaneously as needed without also removing significant portions of the die, leading to decreases in yield. Reducing the CTE mismatch of the materials involved can reduce die warpage, but cannot completely eliminate the warpage due to material formulation limitations.

BRIEF DESCRIPTION OF THE DRAWINGS

FIG. 3A is a cross-sectional illustration of a glass carrier, in accordance with an embodiment.

FIG. 3B is a cross-sectional illustration after a glass core is placed over the glass carrier, in accordance with an embodiment.

FIG. 3C is a cross-sectional illustration after a resist layer is disposed over the glass core, in accordance with an embodiment.

FIG. 3F is a cross-sectional illustration after the conductive vias are planarized with a surface of the glass core, in accordance with an embodiment.

FIG. 3G is a cross-sectional illustration after a plurality of first dies are disposed over the carrier within a perimeter of the glass core, in accordance with an embodiment.

FIG. 3H is a cross-sectional illustration after a mold layer is formed over the first dies, in accordance with an embodiment.

FIG. 3I is a cross-sectional illustration after the plurality of first dies are communicatively coupled with a bridge, in accordance with an embodiment.

EMBODIMENTS OF THE PRESENT DISCLOSURE

Described in embodiments herein are electronics packages with a plurality of interconnected dies surrounded by a glass core, and methods of forming such packages. In the following description, various aspects of the illustrative implementations will be described using terms commonly employed by those skilled in the art to convey the substance of their work to others skilled in the art. However, it will be apparent to those skilled in the art that embodiments disclosed herein may be practiced with only some of the described aspects. For purposes of explanation, specific numbers, materials and configurations are set forth in order to provide a thorough understanding of the illustrative implementations. However, it will be apparent to one skilled in the art that embodiments disclosed herein may be practiced without the specific details. In other instances, well-known features are omitted or simplified in order not to obscure the illustrative implementations.

Various operations will be described as multiple discrete operations, in turn, in a manner that is most helpful in understanding embodiments disclosed herein, however, the order of description should not be construed to imply that these operations are necessarily order dependent. In particular, these operations need not be performed in the order of presentation.

As noted above, die warpage is increasingly problematic in multi-die architectures. Accordingly, embodiments described herein include a glass core that surrounds the multiple die. Additionally, embodiments include a glass carrier that is used during assembly processes. The glass carrier and glass core increase the stiffness and provide a dimensionally stable base on which the multi-die components may be assembled. Furthermore, the glass components may be tailored to match the CTE of the multi-chip components more effectively than other materials (e.g., build-up dielectrics, encapsulation dielectrics, and die backside films (DBF). In yet another embodiment where coarser node/base dies need to be interconnected (e.g., with an embedded multi-die interconnect bridge (EMIB)), the EMIB process may be implemented in the initial stages of package manufacture, and therefore provides improved yield.

Figure 1:
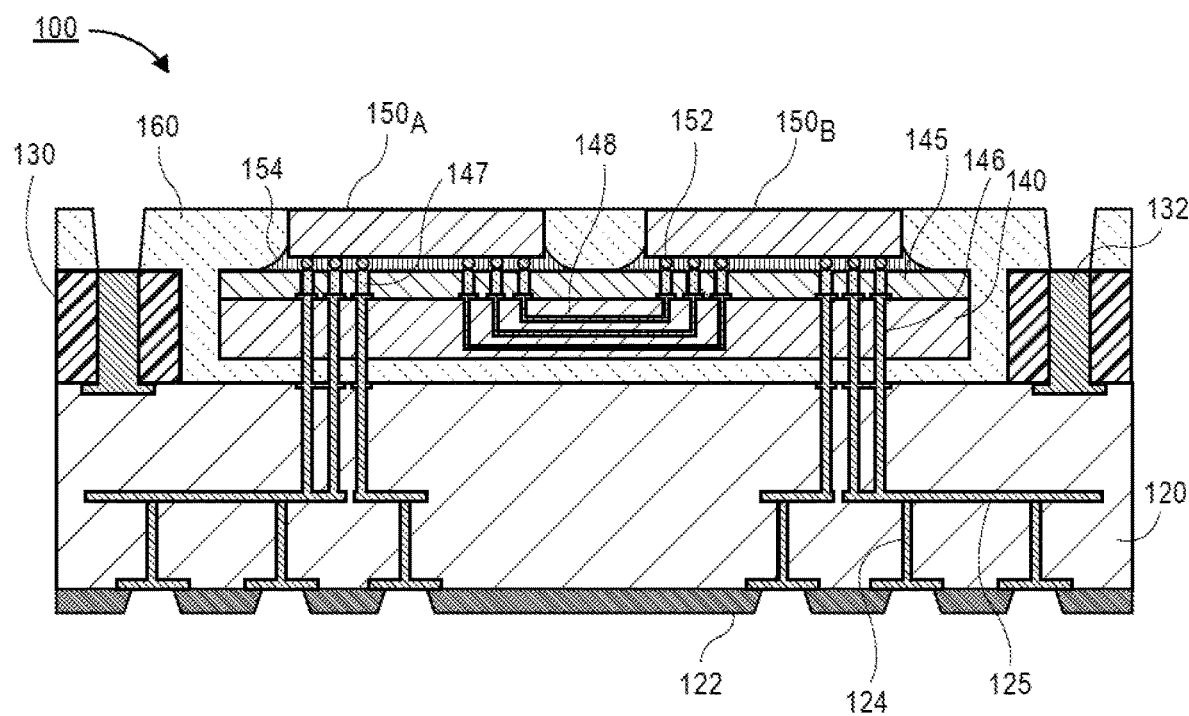
FIG. 1 is a cross-sectional illustration of an electronics package with a plurality of first dies and a plurality of second dies that are surrounded by a glass core, in accordance with an embodiment.

Referring now to FIG. 1 a cross-sectional illustration of an electronic device package 100 is shown, in accordance with an embodiment. In an embodiment, the package 100 may comprise a glass core 130. In an embodiment, the glass core 130 surrounds a first die 140. The use of a glass core 130 allows for the CTE of the core to be matched to the CTE of various components in the package 100 in order to decrease warpage. In an embodiment, the CTE of the glass core 130 may be substantially similar to the CTE of an encapsulation layer 160 that surrounds the first die 140. As used herein, substantially the same CTE refers to a first CTE that is within +/−5% of a second CTE. In an embodiment, conductive vias 132 may be formed through the glass core 130. In an embodiment, the glass core 130 may have a thickness that is same as the thickness of the first die 140. In a particular embodiment, the thickness of the glass core 140 may be between 50 µm and 150 µm.

In an embodiment, a plurality of second dies 150 may be mounted over the first die 140. For example, a second dies $150_A$ and $150_B$ are positioned over the first die 140. While two second dies 150 are illustrated in FIG. 1, it is to be appreciated that any number of second dies 150 may be positioned over the first die 140. In an embodiment, the second dies 150 may be electrically coupled to the first die 140 with first level interconnects (FLI) 152 and solder 147 through a die backside film (DBF) 145 of the first die 140. In an embodiment, an underfill material 154 may surround the FLIs 152 below the second dies 150. In an embodiment, the plurality of second dies 150 may also be communicatively coupled to each other by conductive traces 148 within the first die 140. In an embodiment, the first die 140 may also comprise a plurality of through silicon vias (TSVs) 146. In an embodiment, the second dies 150 may be fully or partially embedded in the encapsulation layer 160. For example, in the illustrated embodiment, the backside surface of the second dies 150 are exposed. In such embodiments, an integrated heat spreader (not shown) may be attached to the second dies 150 to improve the thermal performance of the package 100.

In an embodiment, the first die 140 and the second dies 150 are both active dies (i.e., the first die 140 and the second dies 150 each comprise active devices, such as transistors or the like). In an embodiment the first die 140 includes active devices at a first processing node and the second dies include active device at a second processing node. In a particular embodiment, the second processing node is a more advanced node (i.e., at smaller transistor gate lengths) than the first processing node. For example, the second processing node may be at the 7 nm node, and the first processing node may be at the 10 nm node or larger. However, it is to be appreciated that the first node and the second node may be any processing node. In some embodiments, the first node and the second node may be the same node. Furthermore, while referred to as a die, the first die 140 is not limited to being an active device die. For example, the first die 140 may also refer to an interposer or a bridge that merely provides electrical connections 148 between the second dies 150.

In an embodiment, the glass core 130 may be over a redistribution layer (RDL). The illustrated RDL is shown as having a single dielectric build-up layer 120 for simplicity, and those skilled in the art will recognize that the RDL may comprise a plurality of build-up layers 120. The RDL may comprise a plurality of conductive traces 125 and vias 124, as is known in the art. In an embodiment, the RDL may be referred to as a fan-out structure since the conductive traces 125 and vias 124 provide routing that allows contacts on the first die to be fanned out beyond a perimeter of the first die 140. In an embodiment, a solder resist layer 122 may be formed over a build-up layer 120 to provide isolation for second level interconnects (SLIs), such as solder bumps (not shown) or the like.

Figure 2:
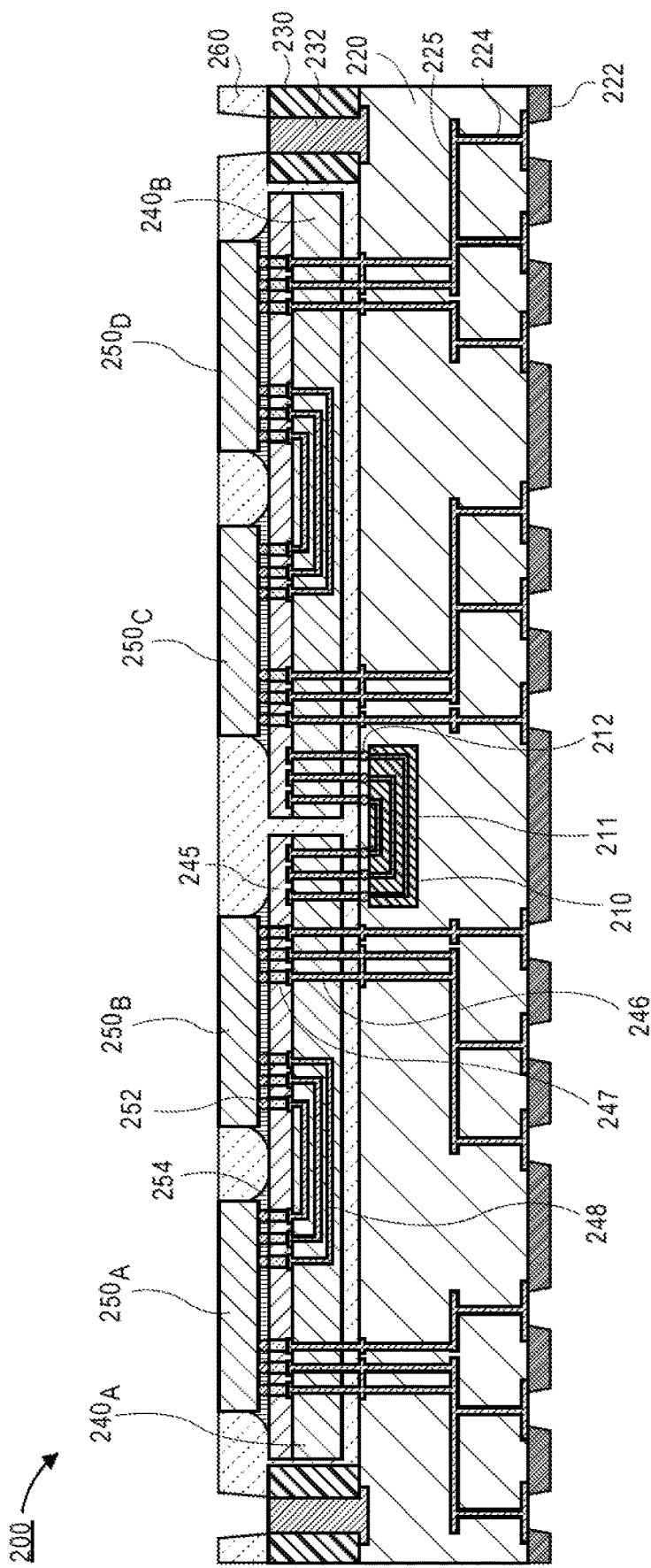
FIG. 2 is a cross-sectional illustration of an electronics package with a first die and a plurality of second dies that are surrounded by a glass core, in accordance with an embodiment.

Referring now to FIG. 2, a cross-sectional illustration of an electronic device package 200 with a plurality of first dies is shown, in accordance with an embodiment. Package 200 may be substantially similar to package 100, with the exception that a plurality of first dies are positioned within the glass core 230. For example, first die 240A and first die 240B may be positioned within the glass core 230. While two first dies 240 are illustrated, it is to be appreciated that any number of first dies 240 may be positioned within the glass core 230. Similar to the package above, conductive vias 232 may be formed through the glass core 230.

In an embodiment, the plurality of first dies 240 may be communicatively coupled by a bridge 210. In an embodiment, the bridge 210 may comprise electrical routing 211 to communicative couple first die 240A to first die 240B. In an embodiment, the bridge 210 may be coupled to the first dies 240 by solder bumps 212. In an embodiment, the bridge 210 may be embedded within the build-up layers 220. In some embodiments, the bridge 210 may be referred to as an embedded multi-die interconnect bridge (EMIB). In an embodiment, the bridge 210 allows for the combined area of the plurality of first dies 240 to be greater than the reticle limit used to form active devices on the first dies 240.

In an embodiment, a plurality of second dies 250 may be communicatively coupled to each of the plurality of first dies 240. For example second dies 250A and 250E may be communicatively coupled to first die 240A, and second dies 250c and 250D may be communicatively coupled to first die 240B. In an embodiment, the second dies 250 may be communicative coupled to the first die by FLIs 252 and solder 247 through a DBF 245 of the first dies 240. In an embodiment, the FLIs 252 may be surrounded by underfill material 254. In an embodiment, second dies 250 formed over the same first die 240 (e.g., second dies 250A and 250B) may be communicatively coupled by conductive traces 248 in the underlying first die 240. In an embodiment, the second dies 250 may be fully or partially embedded within the mold layer 260. For example, in the illustrated embodiment, backside surfaces of the second dies 250 are exposed. In such embodiments, an integrated heat spreader (not shown) may be attached to the second dies to improve thermal performance of the package.

In an embodiment, the RDL of the package 200 in FIG. 2 may be substantially similar to the RDL described above with respect to FIG. 1. For example, the RDL may comprise a plurality of build-up layers 220 that comprise traces 225 and vias 224. In an embodiment, a solder resist layer 222 may be formed over the build-up layer 220.

Figure 3D:
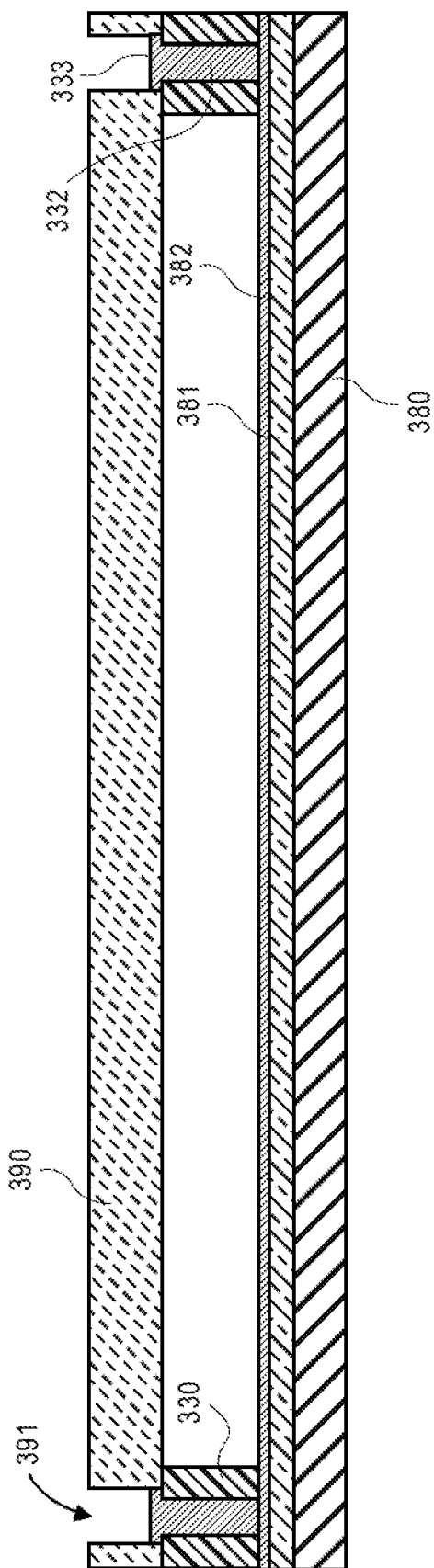
FIG. 3D is a cross-sectional illustration after conductive vias are formed through the glass core, in accordance with an embodiment.
Figure 3E:
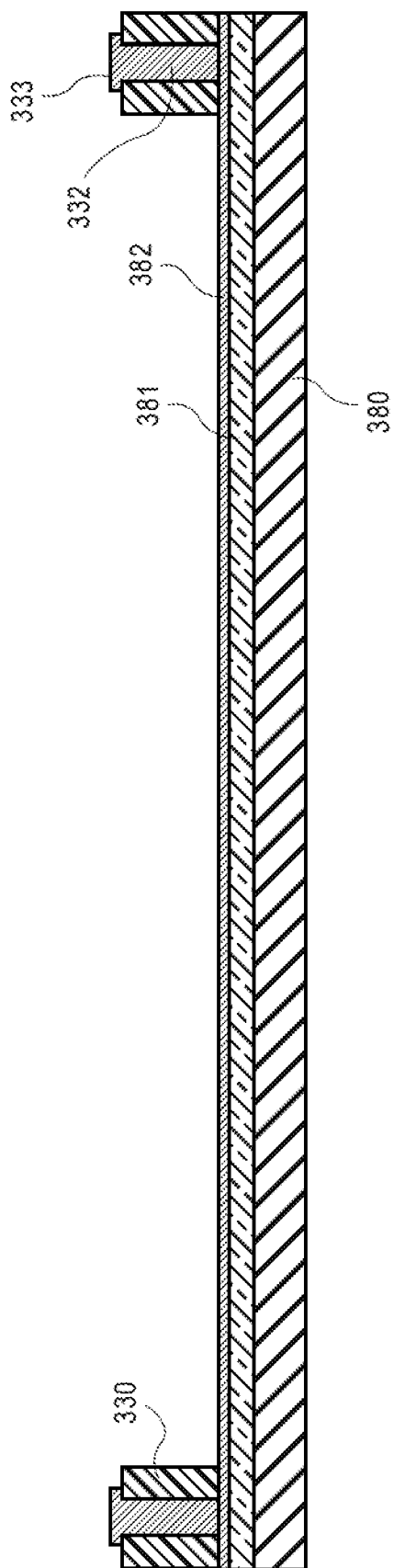
FIG. 3E is a cross-sectional illustration after the resist layer is removed, in accordance with an embodiment.
Figure 3J:
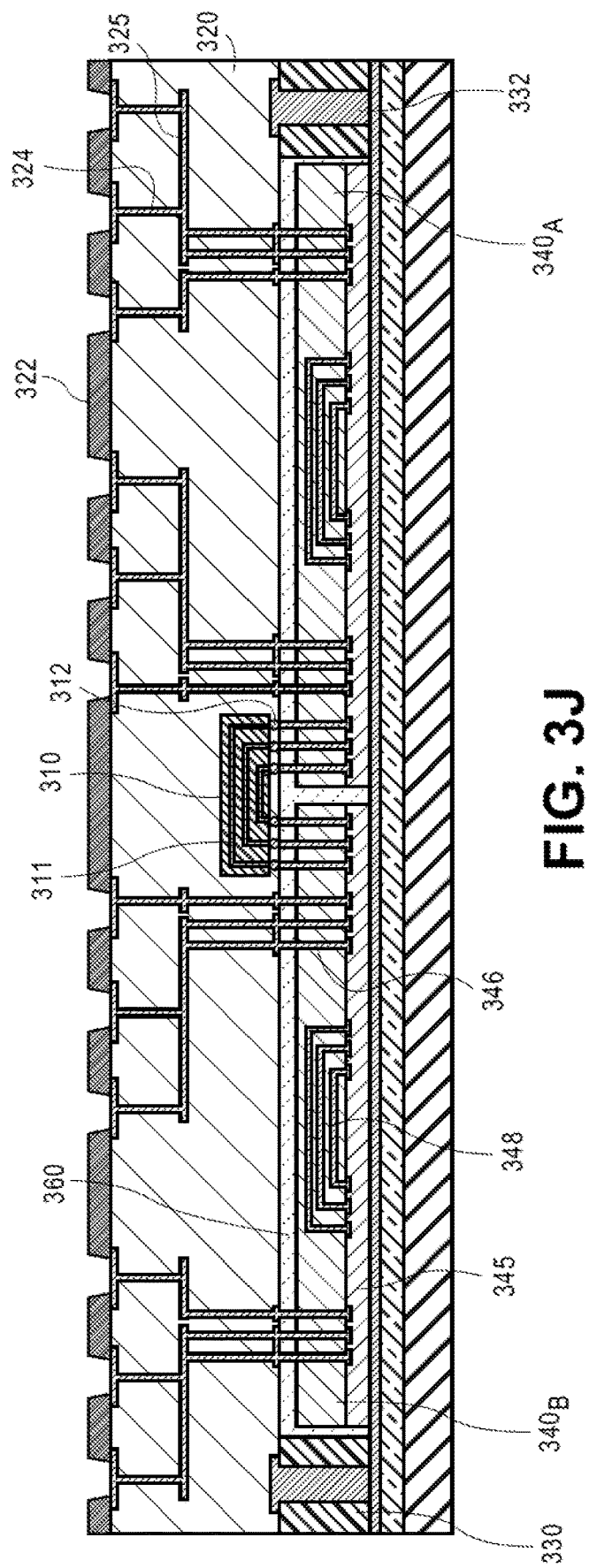
FIG. 3J is a cross-sectional illustration after build-up layers are formed over the plurality of first dies, in accordance with an embodiment.
Figure 3K:
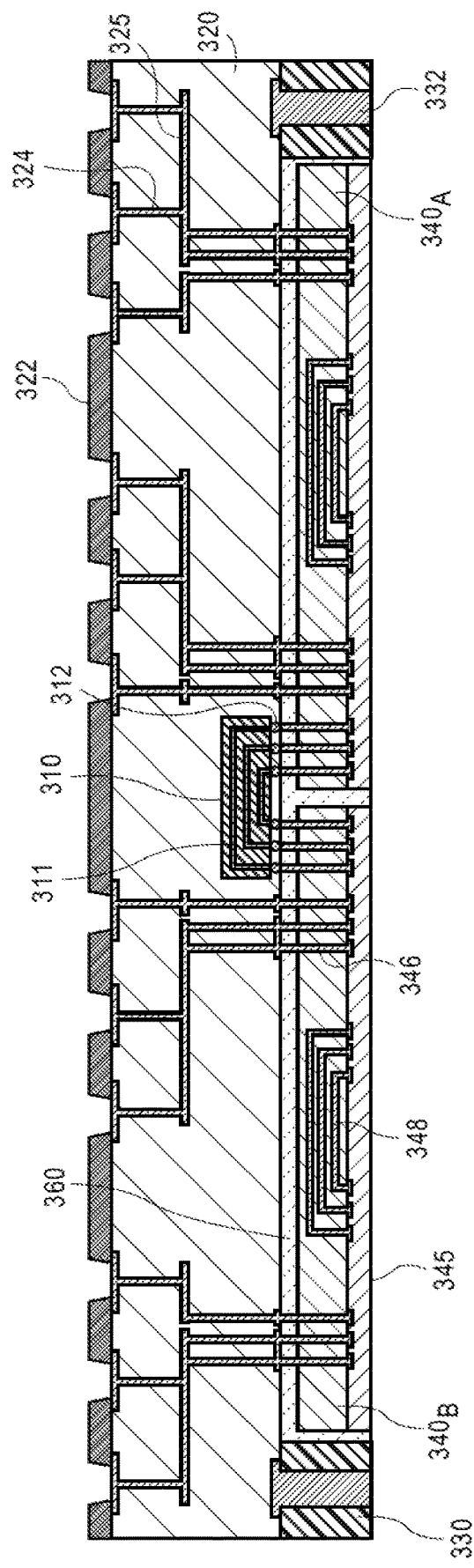
FIG. 3K is a cross-sectional illustration after the glass carrier is removed, in accordance with an embodiment.
Figure 3L:
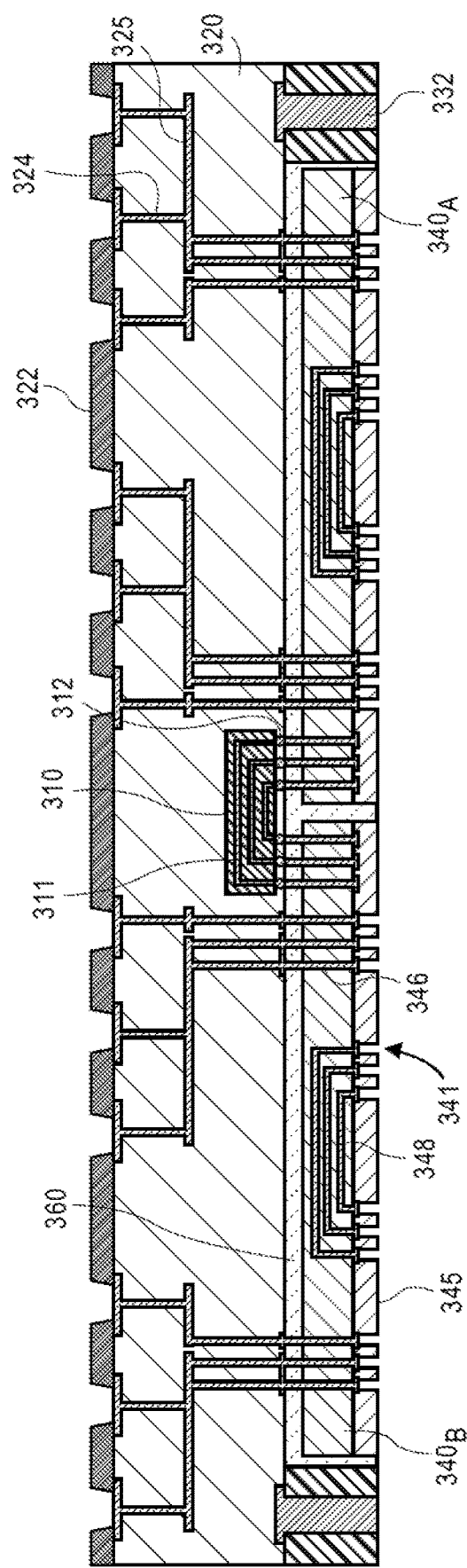
FIG. 3L is a cross-sectional illustration after openings through a die backside film are made to expose contacts of the plurality of first dies, in accordance with an embodiment.
Figure 3M:
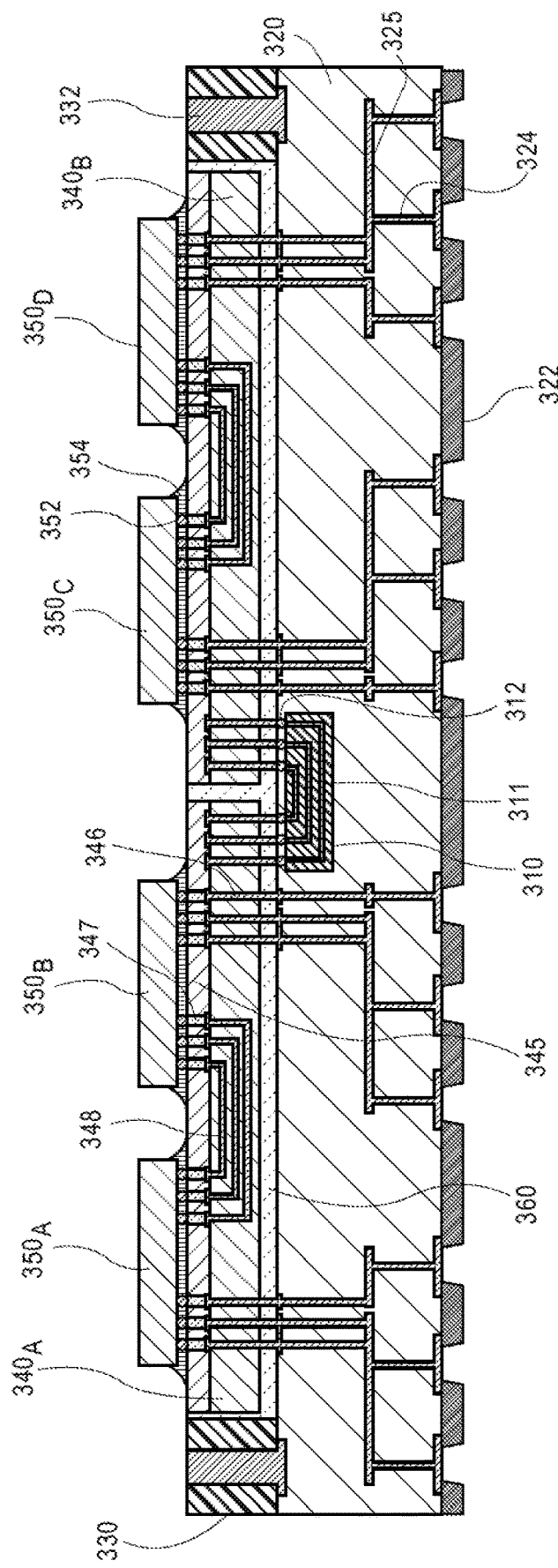
FIG. 3M is a cross-sectional illustration after a plurality of second dies are electrically coupled to the plurality of first dies, in accordance with an embodiment.
Figure 3N:
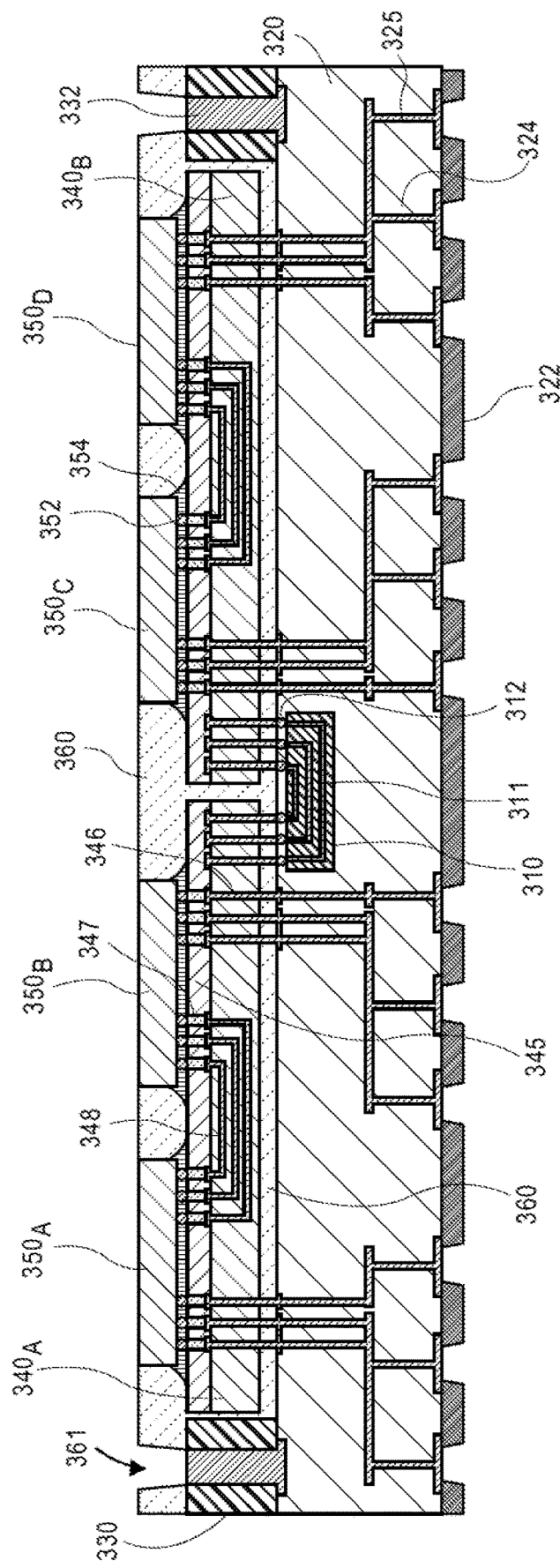
FIG. 3N is a cross-sectional illustration after a mold layer is formed over the plurality of second dies, in accordance with an embodiment.

Referring now to FIGS. 3A-3N, a series of cross-sectional illustrations illustrating a process for forming an electronic device package similar to the package 200 described above with respect to FIG. 2 is shown, in accordance with an embodiment.

Referring now to FIG. 3A, a cross-sectional illustration of a glass carrier 380 is shown, in accordance with an embodiment. In an embodiment, the glass carrier 380 may have a CTE that is substantially the same as the CTE of first dies that will be placed on the glass carrier 380 in a subsequent assembly operation. In an embodiment, a release film 381 may be formed over the glass carrier 380. The release film 381 may be used to release the glass carrier from the interposer in a subsequent assembly operation. In an embodiment, a seed layer 382 may be formed over the release film 381. For example, the seed layer 382 may be copper, titanium, or the like. In an embodiment, the seed layer 382 may be formed with a sputtering process or the like.

Referring now to FIG. 3B, a cross-sectional illustration after a glass core 330 is mounted to the glass carrier 380 is shown, in accordance with an embodiment. In an embodiment, the glass carrier 380 may have a CTE that is substantially equal to the CTE of an encapsulation layer that will be disposed in a subsequent assembly operation. In an embodiment, the CTE of the glass core 330 may be different than the CTE of the glass carrier. In an embodiment, the glass core 330 may have openings 331 for forming a through via.

In an embodiment, the glass core 330 may have a main opening 370 where dies will be placed. In an embodiment, the height H of the glass core 330 is substantially equal to the thickness of a first die that will be mounted to the glass core 380 in a subsequent assembly operation. For example, the height H of the glass core 330 may be between approximately 50 μm and 150 μm depending on the first die thickness.

In an embodiment, the glass core 330 may have an adhesive layer (not shown) that allows for the glass core 330 to adhere to the seed layer 382. In an alternative embodiment, a build-up layer (not shown) may be disposed over the seed layer 382 and the glass core 330 may be pressed into the build-up layer with a pressing tool. In an embodiment, the glass core 330 may be placed on the glass carrier 380 with a pick-and-place tool or the like.

Referring now to FIG. 3C, a cross-sectional illustration after a resist layer 390 is disposed over the glass core 330 and patterned is shown, in accordance with an embodiment. In an embodiment, the resist layer 390 may be a dry-film resist (DFR) or the like. In an embodiment, the resist layer 390 may be patterned to form openings 391 with a lithographic process, or with a laser drilling process. In an embodiment, the openings 391 expose the openings 331 in the glass core 330 while blocking the main opening 370.

Referring now to FIG. 3D, a cross-sectional illustration after vias 332 are formed through the glass core 330 is shown, in accordance with an embodiment. In an embodiment, the vias 332 may be over-plated 333 in order to ensure complete filling of the via openings in the glass core 330. In an embodiment, the vias may be formed with an electroplating process.

Referring now to FIG. 3E, a cross-sectional illustration after the resist layer 390 is stripped is shown, in accordance with an embodiment. In an embodiment, the resist layer 390 may be stripped with any suitable process, such as ashing, wet stripping or the like.

Referring now to FIG. 3F, a cross-sectional illustration after a planarization process is implemented is shown, in accordance with an embodiment. In an embodiment, the overburden 333 may be planarized so that a top surface of the vias 332 is substantially coplanar with a top surface of the glass core 330. In an embodiment, the planarization may be implemented with a chemical mechanical planarization (CMP) process or the like. The planarization process may have a high degree of accuracy due to the presence of the glass core 330 that serves as a stopping point.

Referring now to FIG. 3G, a cross-sectional illustration after first dies 340 are placed over the glass carrier 380 in the main opening 370 of the glass core 330 is shown, in accordance with an embodiment. In an embodiment, a plurality of first dies 340 may be placed in the main opening 370. For example first dies 340A and 340B may be placed in the main opening 370. While two first dies 340 are illustrated, it is to be appreciated that any number of first dies 340 may be placed in the opening 370.

In an embodiment, a DBF 345 may be formed over a front-side surface of the first dies 340 in order to mount the first dies 340 with active surfaces facing the glass carrier 380. In an embodiment, the first dies 340 may also comprise TSVs 346 for providing electrical connections between the backside surface and the front side surface of the first dies 340. In an embodiment, the first dies 340 may also comprise conductive routing 348 that will communicatively couple second dies that will be attached in a subsequent assembly process. In an embodiment, backside pillars 349 may be formed over the TSVs 346 for use in subsequent assembly operations.

In an embodiment, the first dies 340 may be active device dies. For example, the first dies 340 may comprise transistors or the like. In an embodiment, the active devices of the first dies 340 may be formed with a first processing node. For example, the first processing node may be 10 nm or the like. In an embodiment, the first dies 340 may be formed with a processing node that is coarser than the processing node used to form the subsequently packaged second dies. For example, the first dies 340 may be 10 nm node dies and the second dies may be 7 nm node dies. In an additional embodiment, the first dies 340 may also be non-active dies. For example, the first dies 340 may be interposers or bridges. For example, the first dies 340 may comprise conductive traces and vias, but not any active device circuitry, such as transistors.

In an embodiment, the plurality of first dies 340 may be modular components. For example, the first dies 340 may be communicatively coupled in a subsequent assembly operation to function as a single monolithic die. As such, the total area of the first dies 340 may be increased beyond the normal reticle limit of the first processing node.

Referring now to FIG. 3H, a cross-sectional illustration after an encapsulation layer 360 is formed over the first dies 340 is shown, in accordance with an embodiment. In an embodiment, the encapsulation layer 360 may be a dielectric material that is disposed over the first dies 340. In an embodiment, the encapsulation layer 360 may be compression molded, laminated or the like. In an embodiment, the encapsulation layer 360 may have a CTE that is substantially equal to the CTE of the glass core 330. In an embodiment, the encapsulation layer 360 may be disposed over the top surface of the glass core 330 and subsequently planarized to be substantially coplanar with a surface of the glass core 330 (e.g., with a CMP process or the like). In an embodiment, the polishing of the encapsulation layer 360 may expose the vias 332 and the backside pillars 349. Due to the presence of the glass carrier and the glass core, there is minimal die warpage during this polishing operations compared to approaches traditionally used.

Referring now to FIG. 3I, a cross-sectional illustration after a bridge 310 is mounted to the first dies 340 is shown, in accordance with an embodiment. In an embodiment, the bridge 310 comprises conductive traces 311 that are attached to FLIs 312 that provides an electrical connection between first die 340A and first die 340B. In an embodiment, the bridge 310 may be a silicon bridge, or another suitable bridge for forming the fine line/width spacing needed for the bridge 310.

In an embodiment, the bridge 310 may be mounted to the first dies 340 with a thermal compression bonding (TCB) process. In an embodiment, accuracy of bridge 310 placement is high compared to the traditional approaches since the bridge 310 is placed during the initial stages of the package formation and the glass carrier 380 and glass core 330 provide excellent dimensional stability. In some embodiments, a high resolution lithographically patterned layer (not shown) may optionally be added before the bridge 310 is mounted to even further improve accuracy. In an embodiment, the panels may be plasma cleaned, underfill (not shown) may be applied around the FLIs 312, and cured to complete the bridge 310 attach.

Referring now to FIG. 3J, a cross-sectional illustration after an RDL is formed over the first dies 340 is shown, in accordance with an embodiment. In an embodiment, the RDL may comprise one or more build-up layers 320. In an embodiment, conductive traces 325 and vias 324 may be formed in the build-up layers 320. In an embodiment, a solder resist 322 may be applied over the last build-up layer 320.

Referring now to FIG. 3K, a cross-sectional illustration after the glass carrier 380 is removed is shown, in accordance with an embodiment. In an embodiment, the glass carrier 380 may be removed by removing the release film 381, as is known in the art. In an embodiment, the seed layer 382 may be removed with an etching process. In embodiments where the glass core 330 is attached to the seed layer with an adhesive, the adhesive may be cleaned after the seed layer is removed. In embodiments where the glass core 330 is pressed into a dielectric layer, the dielectric layer may be removed (e.g., with laser ablation or dry etch).

Referring now to FIG. 3L, a cross-sectional illustration after via openings 341 are formed through the DBF 345 is shown, in accordance with an embodiment. In an embodiment, the via openings 341 may be formed using dry etch with a mask or laser drills to expose the contacts on the front-side surface of the first dies 340A and 340B.

Referring now to FIG. 3M, a cross-sectional illustration after second dies 350 are attached to the first dies 340 is shown, in accordance with an embodiment. In an embodiment, the second dies 350 may be attached with a TCB process. In an embodiment, solder 347 may fill the via openings in the DBF 345 and FLIs 352 may be used to attach the second dies 350. The FLIs 352 may be surrounded by an underfill material 354.

In the illustrated embodiment second dies 350A and 350E are attached to first die 340A and second dies 350c and 350D are attached to first die 340B. However, it is to be appreciated that any number of second dies 350 may be coupled to each first dies 340. In an embodiment, the first dies 340 may also comprise conductive routing 348 that communicatively couples second dies 350 together. For example, second die 350A is communicatively coupled to second die 350E by conductive routing 348 in first die 340A.

In an embodiment, the second dies 350 may be active devices that comprise circuitry, such as transistors and the like. In an embodiment, the active devices of the second dies 350 are formed at a second processing node. In an embodiment, the second processing node is finer than the first processing node. For example, the second processing node may be 7 nm or finer.

Referring now to FIG. 3N, a cross-sectional illustration after an encapsulation layer 360 is formed over the second dies 350 is shown, in accordance with an embodiment. In an embodiment, the encapsulation layer 360 may be a molded layer. In an embodiment, the encapsulation layer 360 may be polished back to expose the backside surfaces of the second dies 350 to improve thermal performance. To further improve heat dissipation, an integrated heat spreader (not shown) may be attached to the backside surfaces of the second dies 350. In an embodiment, through mold via (TMV) openings 361 may be drilled to expose the copper vias 332, as needed. In an embodiment, the assembled electronic device packages may then be singulated to units.

In an embodiment, if a TCB bridge 310 attach cannot be accomplished at full panel level, TCB attach of the bridge 310 may be implemented at a compatible size and then reconstituted to the desired panel size for redistribution layer processes. The reconstituted panel may then be routed/cut to the desired size for the attachment of the second dies 350.

Referring now to FIG. 4A-4M, a series of cross-sectional illustrations illustrating a process for forming an electronic device package similar to the electronic device package 100 described with respect to FIG. 1 is shown, in accordance with an embodiment.

Figure 4A:
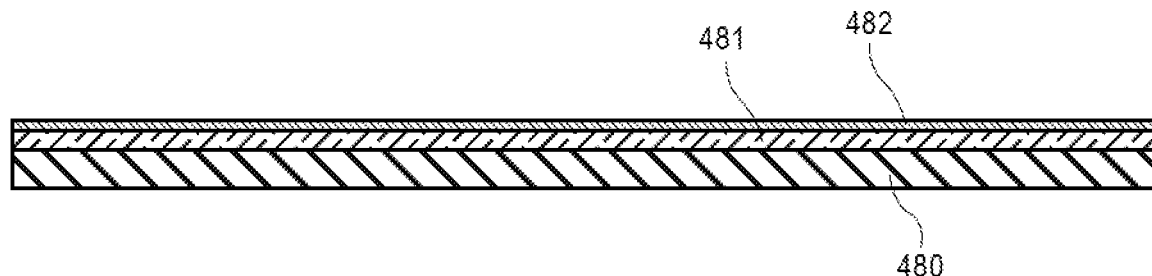
FIG. 4A is a cross-sectional illustration of a glass carrier, in accordance with an embodiment.

Referring now to FIG. 4A, a cross-sectional illustration of a glass carrier 480 is shown, in accordance with an embodiment. In an embodiment, the glass carrier 480 may have a CTE that is substantially the same as the CTE of first die that will be placed on the glass carrier 480 in a subsequent assembly operation. In an embodiment, a release film 481 may be formed over the glass carrier 480. The release film 481 may be used to release the glass carrier from the package in a subsequent assembly operation. In an embodiment, a seed layer 482 may be formed over the release film 481. For example, the seed layer 482 may be a copper, titanium, or the like. In an embodiment, the seed layer 482 may be formed with a sputtering process or the like.

Figure 4B:
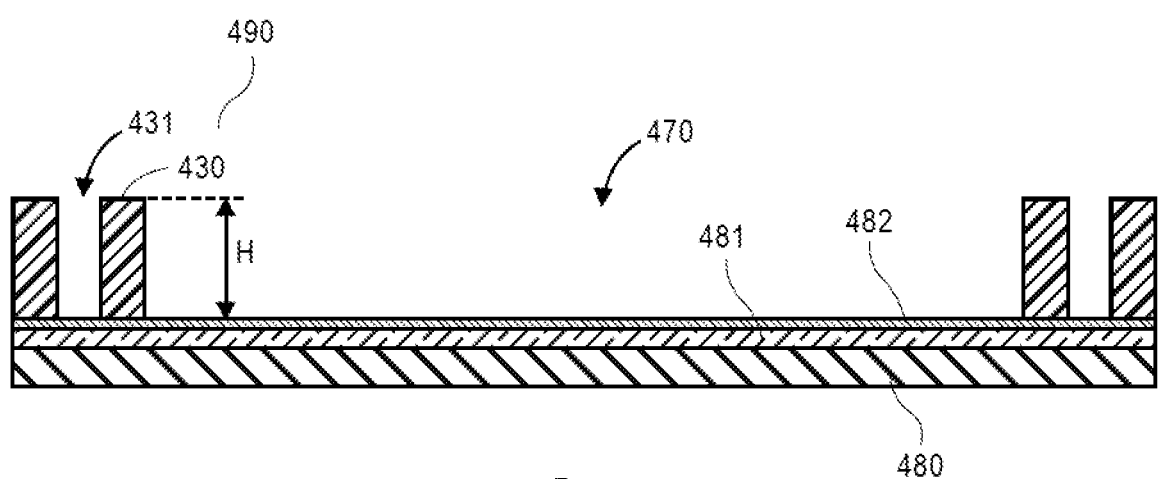
FIG. 4B is a cross-sectional illustration after a glass core is placed on the glass carrier, in accordance with an embodiment.

Referring now to FIG. 4B, a cross-sectional illustration after a glass core 430 is mounted to the glass carrier 480 is shown, in accordance with an embodiment. In an embodiment, the glass carrier 480 may have a CTE that is substantially equal to the CTE of an encapsulation layer that will be disposed in a subsequent assembly operation. In an embodiment, the CTE of the glass core 430 may be different than the CTE of the glass carrier. In an embodiment, the glass core 430 may have openings 431 for forming a through via. In an embodiment, the glass core 430 may have a main opening 470 where a first die will be placed. In an embodiment, the height H of the glass core 430 may be substantially equal to the thickness of a first die that will be mounted to the glass core 480 in a subsequent assembly operation. For example, the height H of the glass core 430 may be between approximately 50 μm and 150 μm depending on the first die thickness.

In an embodiment, the glass core 430 may have an adhesive layer (not shown) that allows for the glass core 430 to adhere to the seed layer 482. In an alternative embodiment, a build-up layer may be disposed over the seed layer 482 and the glass core 430 may be pressed into the build-up layer with a pressing tool. In an embodiment, the glass core 430 may be placed on the glass carrier 480 with a pick-and-place tool or the like.

Figure 4C:
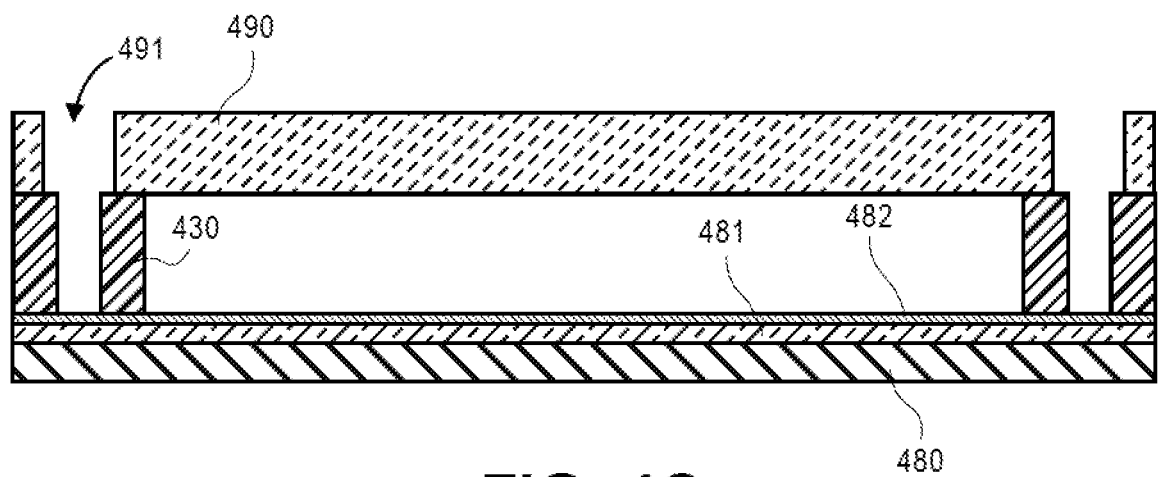
FIG. 4C is a cross-sectional illustration after a resist layer is disposed over the glass core, in accordance with an embodiment.

Referring now to FIG. 4C, a cross-sectional illustration after a resist layer 490 is disposed over the glass core 430 and patterned is shown, in accordance with an embodiment. In an embodiment, the resist layer 490 may be a DFR or the like. In an embodiment, the resist layer 490 may be patterned to form openings 491 with a lithographic process, or with a laser drilling process. In an embodiment, the openings 491 expose the openings 431 in the glass core 430 while blocking the main opening 470.

Figure 4D:
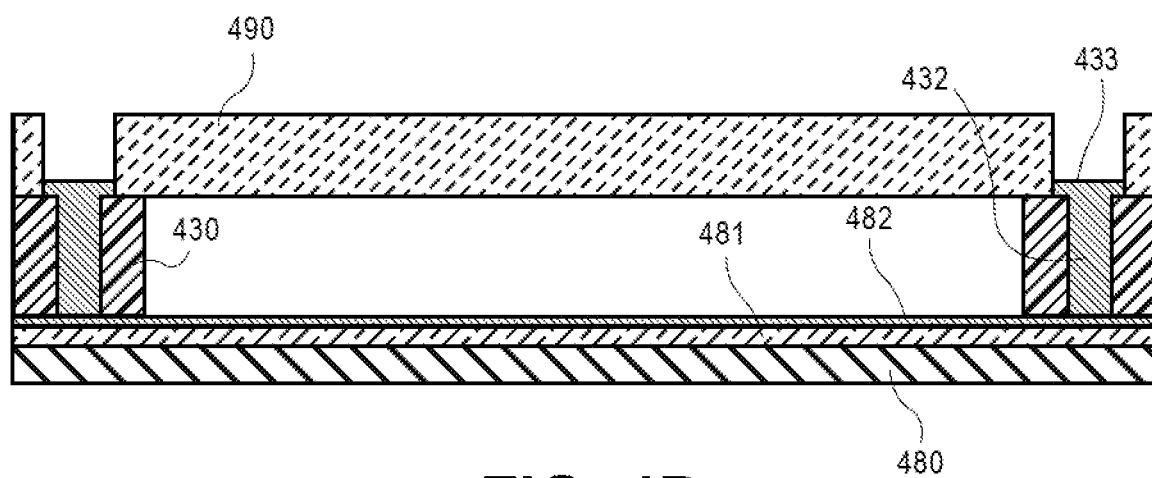
FIG. 4D is a cross-sectional illustration after conductive vias are formed through the glass core, in accordance with an embodiment.

Referring now to FIG. 4D, a cross-sectional illustration after vias 432 are formed through the glass core 430 is shown, in accordance with an embodiment. In an embodiment, the vias 432 may be over-plated 433 in order to ensure complete filling of the via openings in the glass core 430. In an embodiment, the vias may be formed with an electroplating process.

Figure 4E:
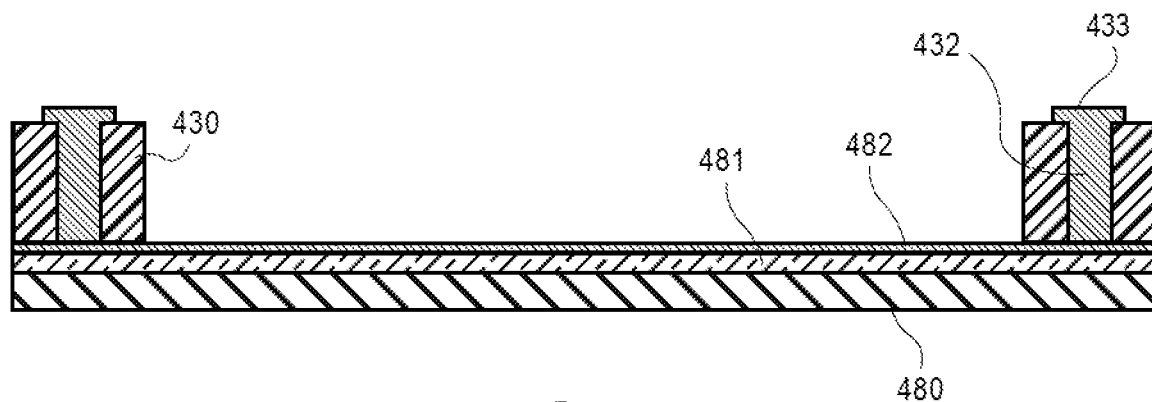
FIG. 4E is a cross-sectional illustration after the resist layer is removed, in accordance with an embodiment.

Referring now to FIG. 4E, a cross-sectional illustration after the resist layer 490 is stripped is shown, in accordance with an embodiment. In an embodiment, the resist layer 490 may be stripped with any suitable process, such as wet stripping, ashing or the like.

Figure 4F:
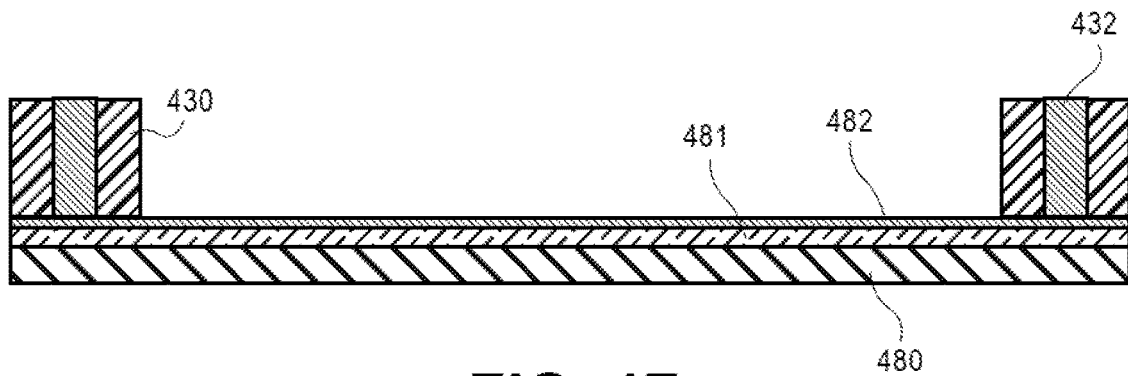
FIG. 4F is a cross-sectional illustration after the conductive vias are planarized with a surface of the glass core, in accordance with an embodiment.

Referring now to FIG. 4F, a cross-sectional illustration after a planarization process is implemented is shown, in accordance with an embodiment. In an embodiment, the overburden 433 may be planarized so that a top surface of the vias 432 is substantially coplanar with a top surface of the glass core 430. In an embodiment, the planarization may be implemented with a CMP process or the like. The planarization process may have a high degree of accuracy due to the presence of the glass core 430 that serves as a stopping point.

Figure 4G:
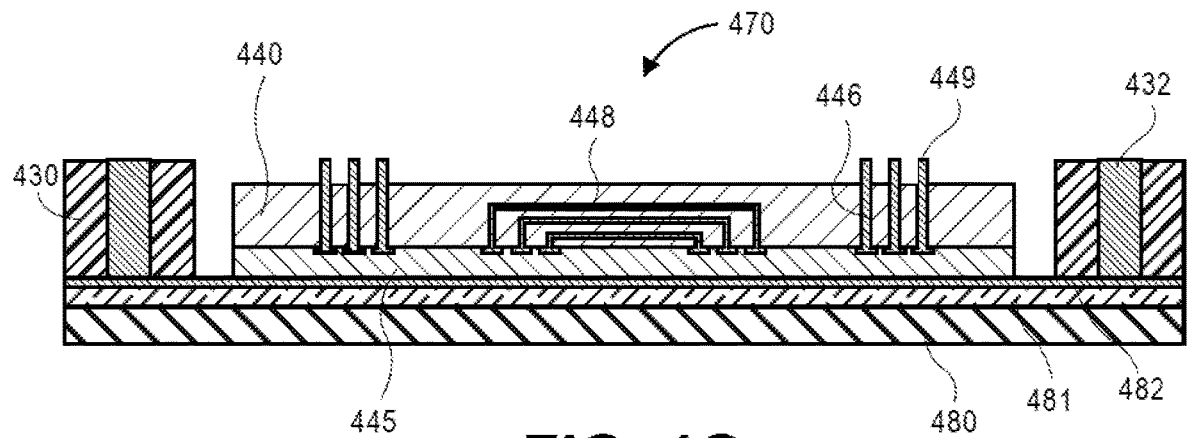
FIG. 4G is a cross-sectional illustration after a first die is placed on the carrier within a perimeter of the glass core, in accordance with an embodiment.

Referring now to FIG. 4G, a cross-sectional illustration after a first die 440 is placed over the glass carrier 480 in the main opening 470 of the glass core 430 is shown, in accordance with an embodiment. In an embodiment, a DBF 445 may be formed over a front-side surface of the first die 440 in order to mount the first die 440 with active surfaces facing the glass carrier 480. In an embodiment, the first die 440 may also comprise TSVs 446 for providing electrical connections between the backside surface and the front side surface of the first die 440. In an embodiment, the first die 440 may also comprise conductive routing 448 that will communicatively couple second dies that will be attached in a subsequent assembly process. In an embodiment, backside pillars 449 may be formed over the TSVs 446 for use in subsequent assembly operations.

In an embodiment, the first die 440 may be an active device die. For example, the first die 440 may comprise transistors or the like. In an embodiment, the active devices of the first die 440 may be formed with a first processing node. For example, the first processing node may be 10 nm or the like. In an embodiment, the first die 440 may be formed with a processing node that is coarser than the processing node used to form the subsequently packaged second dies. For example, the first die 440 may be a 10 nm node die and the second dies may be 7 nm node dies. In an additional embodiment, the first die 440 may also be a non-active die. For example, the first die 440 may be an interposer or a bridge. For example, the first die 440 may comprise conductive traces and vias, but not any active device circuitry, such as transistors.

Figure 4H:
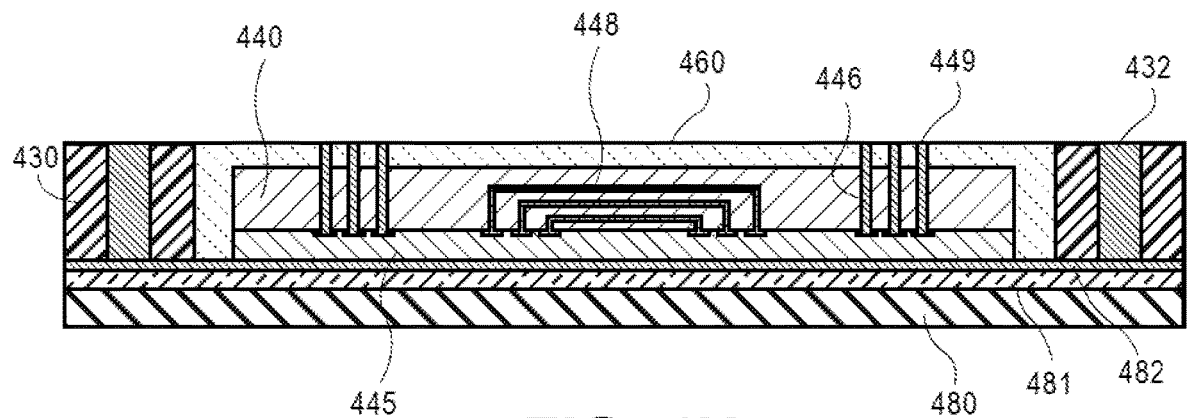
FIG. 4H is a cross-sectional illustration after a mold layer is formed over the first die, in accordance with an embodiment.

Referring now to FIG. 4H, a cross-sectional illustration after an encapsulation layer 460 is formed over the first die 440 is shown, in accordance with an embodiment. In an embodiment, the encapsulation layer 460 may be a dielectric material that is disposed over the first die 440. In an embodiment, the encapsulation layer 460 may be compression molded, laminated or the like. In an embodiment, the encapsulation layer 460 may have a CTE that is substantially equal to the CTE of the glass core 430. In an embodiment, the encapsulation layer 460 may be disposed over the top surface of the glass core 430 and subsequently planarized to be substantially coplanar with a surface of the glass core 430 (e.g., with a CMP process or the like). In an embodiment, the polishing of the encapsulation layer 460 may expose the vias 432 and the backside pillars 449 Due to the presence of the glass carrier and the glass core, there is minimal die warpage during this polishing operations compared to approaches traditionally used.

Figure 4I:
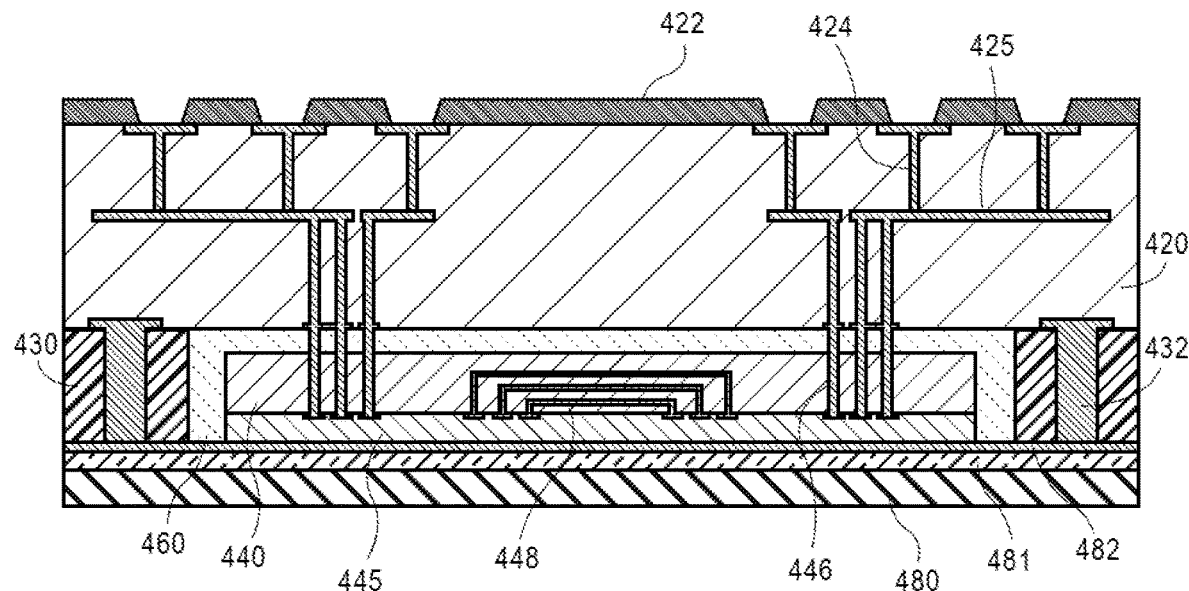
FIG. 4I is a cross-sectional illustration after build-up layers are formed over the first die, in accordance with an embodiment.

Referring now to FIG. 4I, a cross-sectional illustration after an RDL is formed over the first dies 440 is shown, in accordance with an embodiment. In an embodiment, the RDL may comprise one or more build-up layers 420. In an embodiment, conductive traces 425 and vias 424 may be formed in the build-up layers 420. In an embodiment, a solder resist 422 may be applied over the last build-up layer 420.

Figure 4J:
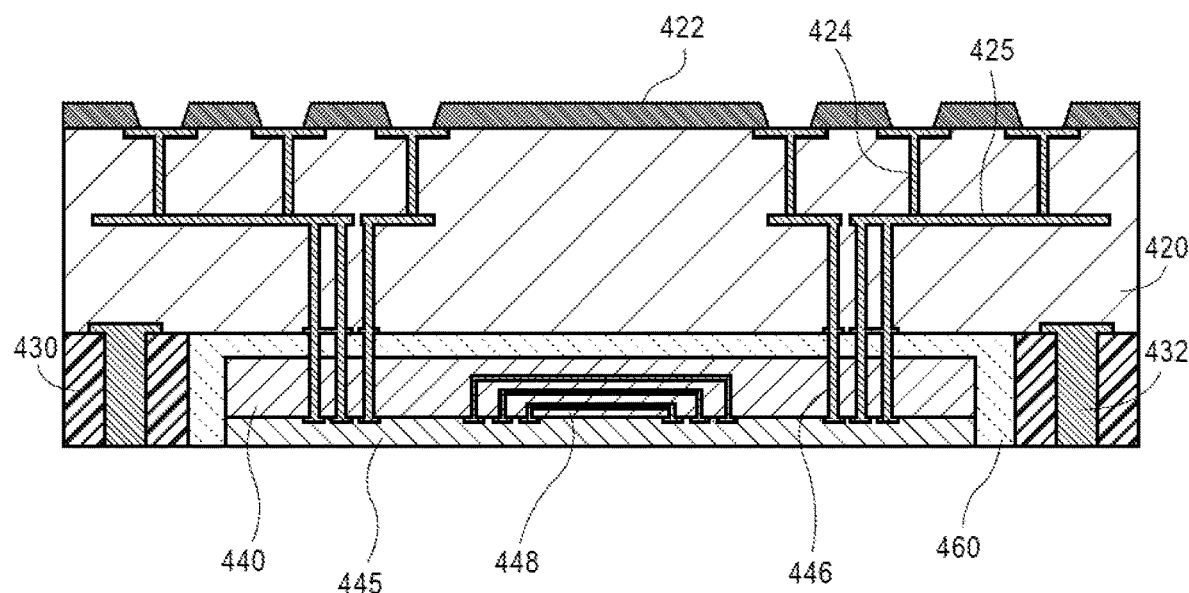
FIG. 4J is a cross-sectional illustration after the glass carrier is removed, in accordance with an embodiment.

Referring now to FIG. 4J, a cross-sectional illustration after the glass carrier 480 is removed is shown, in accordance with an embodiment. In an embodiment, the glass carrier 480 may be removed by removing the release film 481, as is known in the art. In an embodiment, the seed layer 482 may be removed with an etching process. In embodiments where the glass core 430 is attached to the seed layer with an adhesive, the adhesive may be cleaned after the seed layer is removed. In embodiments where the glass core 430 is pressed into a dielectric layer, the dielectric layer may be removed (e.g., with laser ablation or dry etch).

Figure 4K:
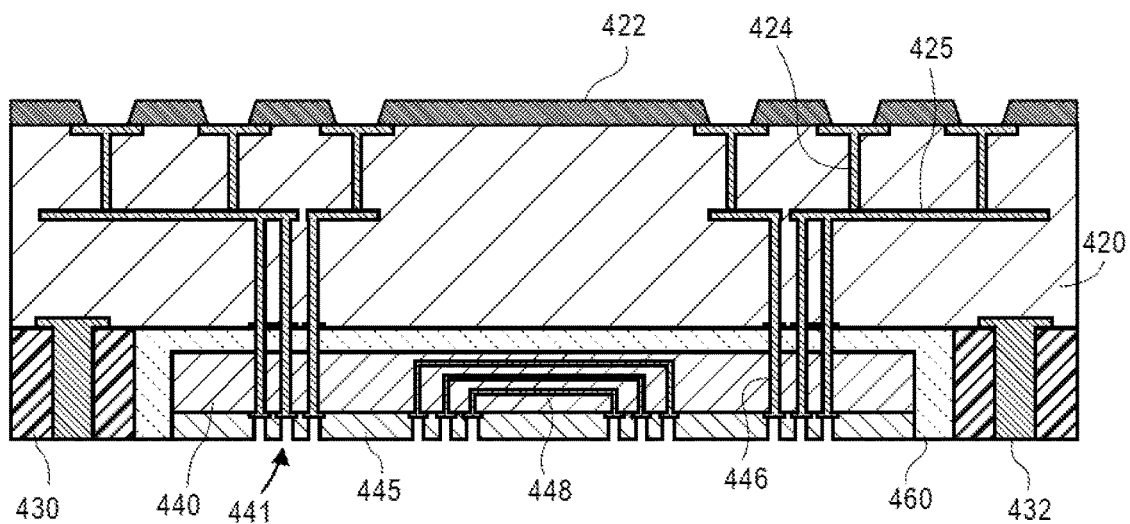
FIG. 4K is a cross-sectional illustration after openings through a die backside film are formed to expose contacts of the first die, in accordance with an embodiment.

Referring now to FIG. 4K, a cross-sectional illustration after via openings 441 are formed through the DBF 445 is shown, in accordance with an embodiment. In an embodiment, the via openings 441 may be formed using dry etch with a mask or laser drills to expose the contacts on the front-side surface of the first die 440.

Figure 4L:
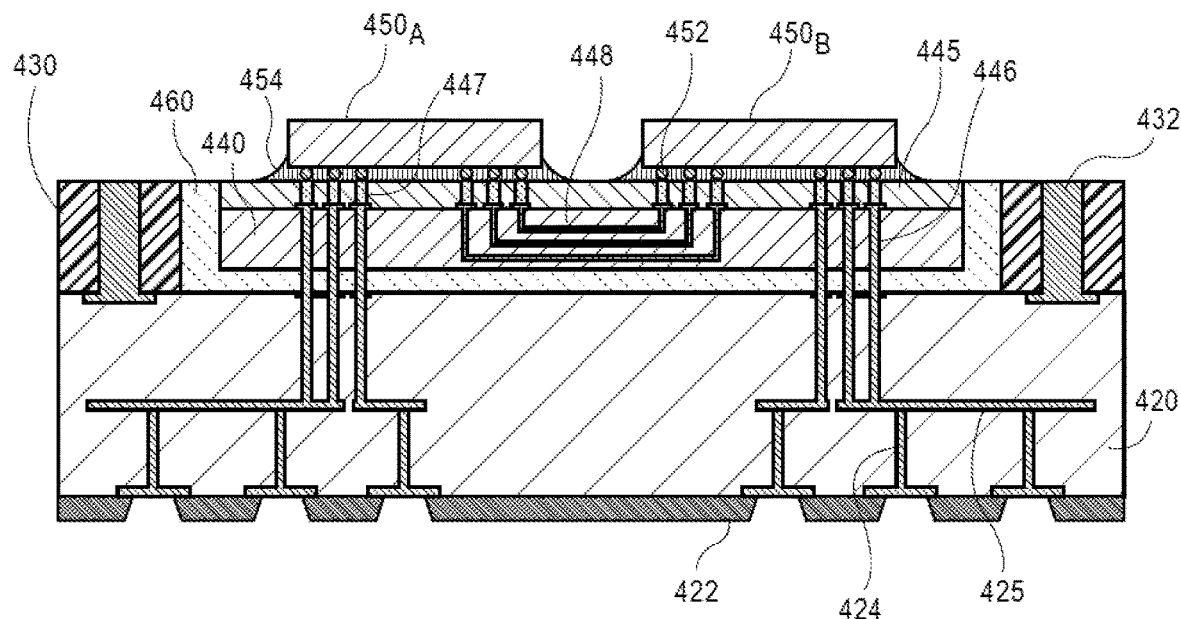
FIG. 4L is a cross-sectional illustration after a plurality of second dies are electrically coupled to the first die, in accordance with an embodiment.

Referring now to FIG. 4L, a cross-sectional illustration after second dies 450 are attached to the first die 440 is shown, in accordance with an embodiment. In an embodiment, the second dies 450 may be attached with a TCB process. In an embodiment, solder 447 may fill the via openings in the DBF 445 and FLIs 452 may be used to attach the second dies 450. The FLIs 452 may be surrounded by an underfill material 454.

In the illustrated embodiment second dies $450_A$ and $450_B$ are attached to the first die 440. However, it is to be appreciated that any number of second dies 450 may be coupled to the first die 440. In an embodiment, the first die 440 may also comprise conductive routing 448 that communicatively couples second dies 450 together. For example, second die $450_A$ is communicatively coupled to second die $450_B$ by conductive routing 448 in first die 440.

In an embodiment, the second dies 450 may be active devices that comprise circuitry, such as transistors and the like. In an embodiment, the active devices of the second dies 450 are formed at a second processing node. In an embodiment, the second processing node is finer than the first processing node. For example, the second processing node may be 7 nm or finer.

Figure 4M:
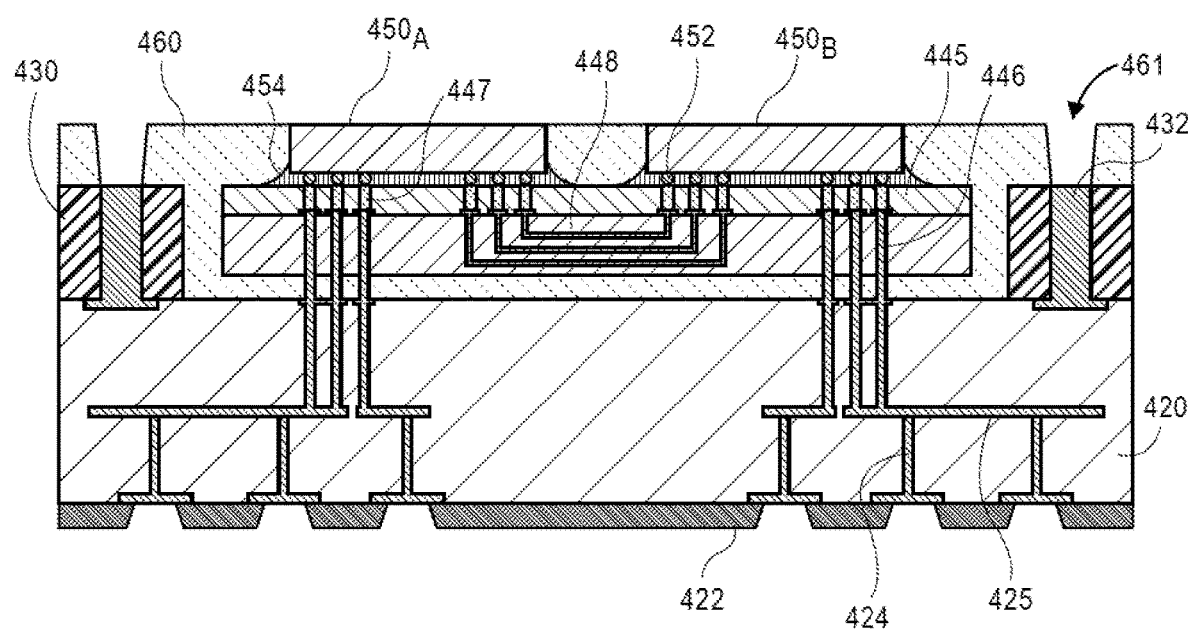
FIG. 4M is a cross-sectional illustration after a mold layer is formed over the plurality of second dies, in accordance with an embodiment.

Referring now to FIG. 4M, a cross-sectional illustration after an encapsulation layer 460 is formed over the second dies 450 is shown, in accordance with an embodiment. In an embodiment, the encapsulation layer 460 may be a molded layer. In an embodiment, the encapsulation layer 460 may be polished back to expose the backside surfaces of the second dies 450 to improve thermal performance. To further improve heat dissipation, an integrated heat spreader (not shown) may be attached to the backside surfaces of the second dies 450. In an embodiment, TMV openings 461 may be drilled to expose the copper vias 432, as needed. In an embodiment, the assembled electronic device packages may then be singulated to units.

Figure 5:
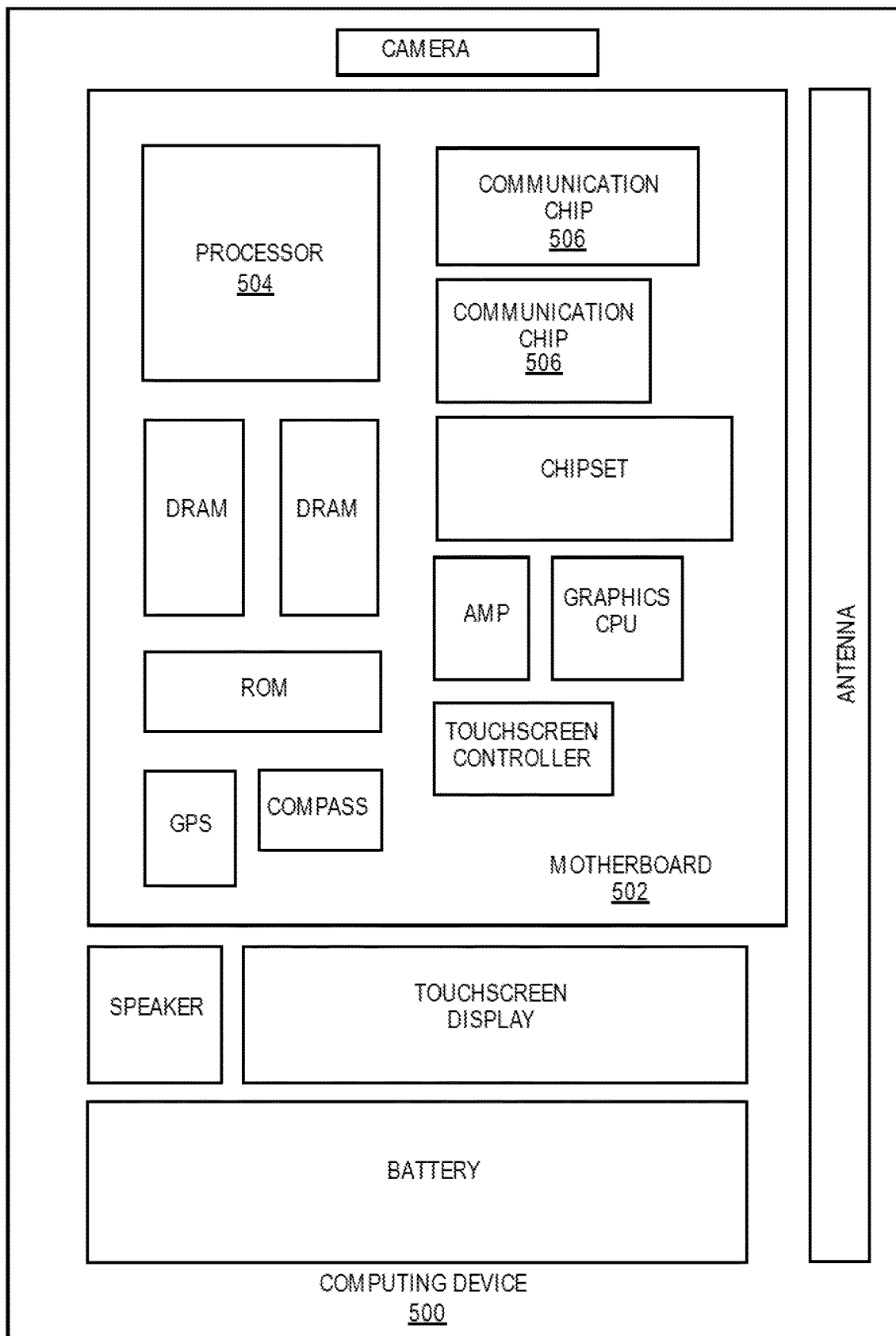
FIG. 5 is a schematic of a computing device built in accordance with an embodiment.

FIG. 5 illustrates a computing device 500 in accordance with one implementation disclosed herein. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations disclosed herein, the integrated circuit die of the processor may be embedded in a package and surrounded by a glass core, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation disclosed herein, the integrated circuit die of the communication chip may be embedded in a package and surrounded by a glass core, in accordance with embodiments described herein.

The above description of illustrated implementations disclosed herein, including what is described in the Abstract, is not intended to be exhaustive or to limit embodiments disclosed herein to the precise forms disclosed. While specific implementations of, and examples for, embodiments are described herein for illustrative purposes, various equivalent modifications are possible within the scope of embodiments, as those skilled in the relevant art will recognize.

These modifications may be made to the embodiments disclosed herein in light of the above detailed description. The terms used in the following claims should not be construed to limit embodiments disclosed herein to the specific implementations disclosed in the specification and the claims. Rather, the scope of embodiments disclosed herein is to be determined entirely by the following claims, which are to be construed in accordance with established doctrines of claim interpretation.

Example 1: a microelectronic device package, comprising: a redistribution layer (RDL); an interposer over the RDL; a glass core over the RDL and surrounding the interposer; and a plurality of dies over the interposer, wherein the plurality of dies are communicatively coupled with the interposer.

Example 2: the microelectronic device package of Example 1, further comprising: conductive vias formed through the glass core.

Example 3: the microelectronic device package of Example 1 or Example 2, wherein a thickness of the glass core is substantially the same as the thickness of the interposer.

Example 4: the microelectronic device package of Examples 1-3, wherein the interposer is embedded in a mold layer.

Example 5: the microelectronic device package of Examples 1-4, wherein the plurality of dies are embedded in the mold layer.

Example 6: the microelectronic device package of Examples 1-5, wherein the plurality of dies are communicatively coupled to each other by conductive traces in the interposer.

Example 7: the microelectronic device package of Examples 1-6, wherein the interposer is an active die.

Example 8: the microelectronic device package of Examples 1-7, wherein the active die comprises active devices at a first process node, and wherein the plurality of dies comprise active devices at a second process node.

Example 9: the microelectronic device package of Examples 1-8, wherein the interposer is a bridge.

Example 10: the microelectronic device package of Examples 1-9, further comprising a plurality of interposers, wherein the plurality of interposers are surrounded by the glass core.

Example 11: the microelectronic device package of Examples 1-10, wherein the plurality of interposers are communicatively coupled to each other by a bridge.

Example 12: the microelectronic device package of Examples 1-11, wherein the bridge is positioned over a surface of the plurality of interposers that is opposite from the plurality of dies.

Example 13: the microelectronic device package of Examples 1-12, wherein the bridge is within the RDL.

Example 14: the microelectronic device package of Examples 1-13, wherein the bridge is an embedded multi-die interconnect bridge (EMIB).

Example 15: the microelectronic device package of Examples 1-14, wherein a CTE of the glass core matches a CTE of a dielectric layer surrounding the interposer.

Example 16: a method for forming a microelectronic device package, comprising: attaching a glass core to a glass carrier, wherein the glass carrier comprises a glass substrate, a release film, and a seed layer; forming a conductive via through the glass core; disposing an interposer over the glass carrier within the glass core; disposing a dielectric material over the interposer; forming a redistribution layer (RDL) over the dielectric layer and the glass core; detaching the glass carrier; and mounting a plurality of dies over the interposer, wherein the plurality of dies are communicatively coupled to the interposer.

Example 17: the method of Example 16, wherein the interposer is an active interposer, wherein the active interposer comprises active devices at a first node, and wherein the plurality of dies comprise active devices at a second node.

Example 18: the method of Example 16 or Example 17, wherein the glass carrier has a CTE that is substantially equal to the CTE of the interposer.

Example 19: the method of Examples 16-18, wherein the glass core has a CTE that is substantially equal to the CTE of the dielectric material.

Example 20: the method of Examples 16-19, further comprising: disposing a plurality of interposers over the glass carrier within a perimeter of the core.

Example 21: the method of Examples 16-20, further comprising: communicatively coupling the plurality of interposers with a bridge.

Example 22: a computing system, comprising: redistribution layer (RDL); a glass core over the RDL; a plurality of first dies within a perimeter of the glass core, wherein the plurality of first dies are communicatively coupled by a bridge, and wherein the bridge is embedded in the RDL; a plurality of second dies over the first dies, wherein the plurality of first dies are communicatively coupled to the first dies; and a dielectric layer over the first dies and the second dies.

Example 23: the computing system of Example 22, wherein a CTE of the glass core is substantially equal to a CTE of the dielectric layer.

Example 24: the computing system of Example 22 or Example 23, wherein the first dies comprise active devices at a first processing node, and wherein the second dies comprise active devices at a second processing node.

Example 25: the computing system of Examples 22-24, wherein a thickness of the glass core is substantially equal to the thickness of the first dies.

What is claimed is:

1. An electronic device package, comprising:
   a redistribution layer;
   a bridge die above the redistribution layer, the bridge die having a top, a bottom, a first side between the top and bottom, and a second side between the top and bottom, the second side opposite the first side;
   an encapsulation layer laterally adjacent to and in contact with the first side and the second side of the bridge die;
   a core material on the redistribution layer, the core material laterally adjacent to and in contact with the encapsulation layer;
   a first conductive via laterally adjacent to the first side of the bridge die, the first conductive via in and in contact with a first portion of the core material;
   a second conductive via laterally adjacent to the second side of the bridge die, the second conductive via in and in contact with a second portion of the core material;
   a first die coupled to the bridge die; and
   a second die coupled to the bridge die, the second die electrically coupled to the first die by electrical traces in the bridge die.

2. The electronic device package of claim 1, wherein the core material is a glass core material.

3. The electronic device package of claim 1, wherein the core material has a CTE substantially the same as a CTE of the encapsulation layer.

4. The electronic device package of claim 1, wherein the core material has a thickness in a range of 50-150 microns.

5. The electronic device package of claim 1, wherein the redistribution layer comprises a dielectric build-up layer having a plurality of conductive traces therein.

6. The electronic device package of claim 1, further comprising:
   an underfill material, wherein a first portion of the underfill material is between the first die and the bridge die, and wherein a second portion of the underfill material is between the second die and the bridge die.

7. The electronic device package of claim 1, wherein the bridge die comprises a plurality of through silicon vias (TSVs), the plurality of TSVs coupled to the redistribution layer.

8. The electronic device package of claim 1, wherein the encapsulation layer has an uppermost surface co-planar with an uppermost surface of the first die.

9. The electronic device package of claim 6, wherein the uppermost surface of the encapsulation layer is co-planar with an uppermost surface of the second die.

10. The electronic device package of claim 1, wherein the first die is coupled to the bridge die by a first plurality of first level interconnects, and the second die is coupled to the bridge die by a second plurality of first level interconnects.

11. A system, comprising:
a board; and
an electronic device package coupled to the board, the electronic device package, comprising:
  a redistribution layer;
  a bridge die above the redistribution layer, the bridge die having a top, a bottom, a first side between the top and bottom, and a second side between the top and bottom, the second side opposite the first side;
  an encapsulation layer laterally adjacent to and in contact with the first side and the second side of the bridge die;
  a core material on the redistribution layer, the core material laterally adjacent to and in contact with the encapsulation layer;
  a first conductive via laterally adjacent to the first side of the bridge die, the first conductive via in and in contact with a first portion of the core material;
  a second conductive via laterally adjacent to the second side of the bridge die, the second conductive via in and in contact with a second portion of the core material;
  a first die coupled to the bridge die; and
  a second die coupled to the bridge die, the second die electrically coupled to the first die by electrical traces in the bridge die.

12. The system of claim 11, further comprising:
a processor coupled to the board.

13. The system of claim 11, further comprising:
a memory coupled to the board.

14. The system of claim 11, further comprising:
a communication chip coupled to the board.

15. The system of claim 11, further comprising:
a display coupled to the board.

16. The system of claim 11, further comprising:
a camera coupled to the board.

17. The system of claim 11, further comprising:
a GPS coupled to the board.

18. The system of claim 11, further comprising:
a battery coupled to the board.

19. The system of claim 11, further comprising:
a compass coupled to the board.

20. The system of claim 11, further comprising:
a speaker coupled to the board.

* * * * *